United States Patent
Nugent, Jr. et al.

(10) Patent No.: US 9,625,528 B2
(45) Date of Patent: Apr. 18, 2017

(54) SYSTEM AND METHOD FOR CHARGING A BATTERY WITH PARASITIC LOAD COMPENSATION

(71) Applicant: Kussmaul Electronics Co., Inc., West Sayville, NY (US)

(72) Inventors: Thomas H. Nugent, Jr., Port Jefferson Station, NY (US); Paul Lamattina, Miller Place, NY (US)

(73) Assignee: Kussmaul Electronics Co., Inc., West Sayville, NY (US)

( * ) Notice: Subject to any disclaimer, the term of this patent is extended or adjusted under 35 U.S.C. 154(b) by 175 days.

(21) Appl. No.: 14/555,964

(22) Filed: Nov. 28, 2014

(65) Prior Publication Data

US 2016/0156209 A1   Jun. 2, 2016

(51) Int. Cl.
*H02J 7/00* (2006.01)
*G01R 31/36* (2006.01)
*H02J 7/14* (2006.01)

(52) U.S. Cl.
CPC ........ *G01R 31/3606* (2013.01); *H02J 7/0068* (2013.01); *H02J 7/1438* (2013.01)

(58) Field of Classification Search
CPC ............................ G01R 31/3606; H02J 7/0052
See application file for complete search history.

(56) References Cited

U.S. PATENT DOCUMENTS

2015/0188323 A1* 7/2015 Muralidhar ........... H02J 7/0004
62/230

* cited by examiner

*Primary Examiner* — Vuthe Siek

(57) ABSTRACT

A battery charger is configured to perform a battery charging method. The method includes determining a magnitude of a parasitic load on a battery. The method also includes adjusting an absorption stage of a multi-step charging process for the battery based on the determined magnitude of the parasitic load. The method further includes charging the battery using the multi-step charging process with the adjusted absorption stage.

20 Claims, 2 Drawing Sheets

SYSTEM AND METHOD FOR CHARGING A BATTERY WITH PARASITIC LOAD COMPENSATION

TECHNICAL FIELD

This disclosure is generally directed to a system and method for charging a battery with parasitic load compensation.

BACKGROUND

Battery chargers, such as those for charging a vehicle battery, are typically either a float charger or a multi-step charger. A float charger maintains a specific predetermined charging voltage while it charges the battery. In contrast, a multi-step charger maintains different voltage levels during different stages of the charging process in order to provide a more rapid charging sequence. One common multi-step battery charger is a three-step battery charger.

SUMMARY

This disclosure provides a system and method for charging a battery while compensating for parasitic loads on the battery.

In a first embodiment, a method includes determining a magnitude of a parasitic load on a battery. The method also includes adjusting an absorption stage of a multi-step charging process for the battery based on the determined magnitude of the parasitic load. The method further includes charging the battery using the multi-step charging process with the adjusted absorption stage.

In a second embodiment, a battery charging apparatus includes a memory and a controller. The controller is configured to determine a magnitude of a parasitic load on a battery and store the determined magnitude of the parasitic load in the memory, adjust an absorption stage of a multi-step charging process for the battery based on the determined magnitude of the parasitic load, and control a charging of the battery using the multi-step charging process with the adjusted absorption stage.

In a third embodiment, a non-transitory computer readable storage medium includes instructions that, when executed by at least one processing device, cause the at least one processing device to determine a magnitude of a parasitic load on a battery, adjust an absorption stage of a multi-step charging process for the battery based on the determined magnitude of the parasitic load, and control a charging of the battery using the multi-step charging process with the adjusted absorption stage.

Other technical features may be readily apparent to one skilled in the art from the following figures, descriptions, and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

Figure 1:
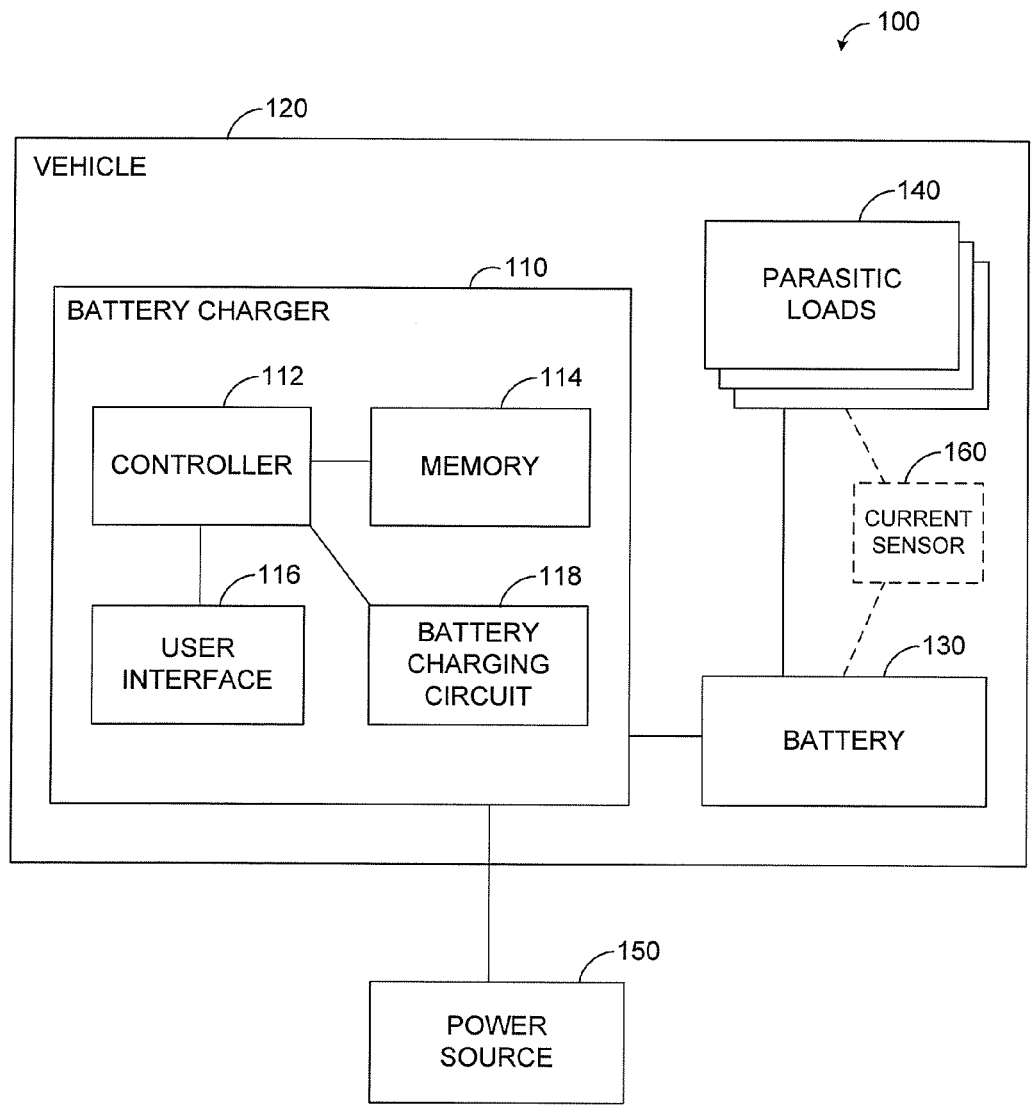
FIG. 1 illustrates an example system for charging a battery with parasitic load compensation, according to an embodiment of this disclosure.
Figure 2:
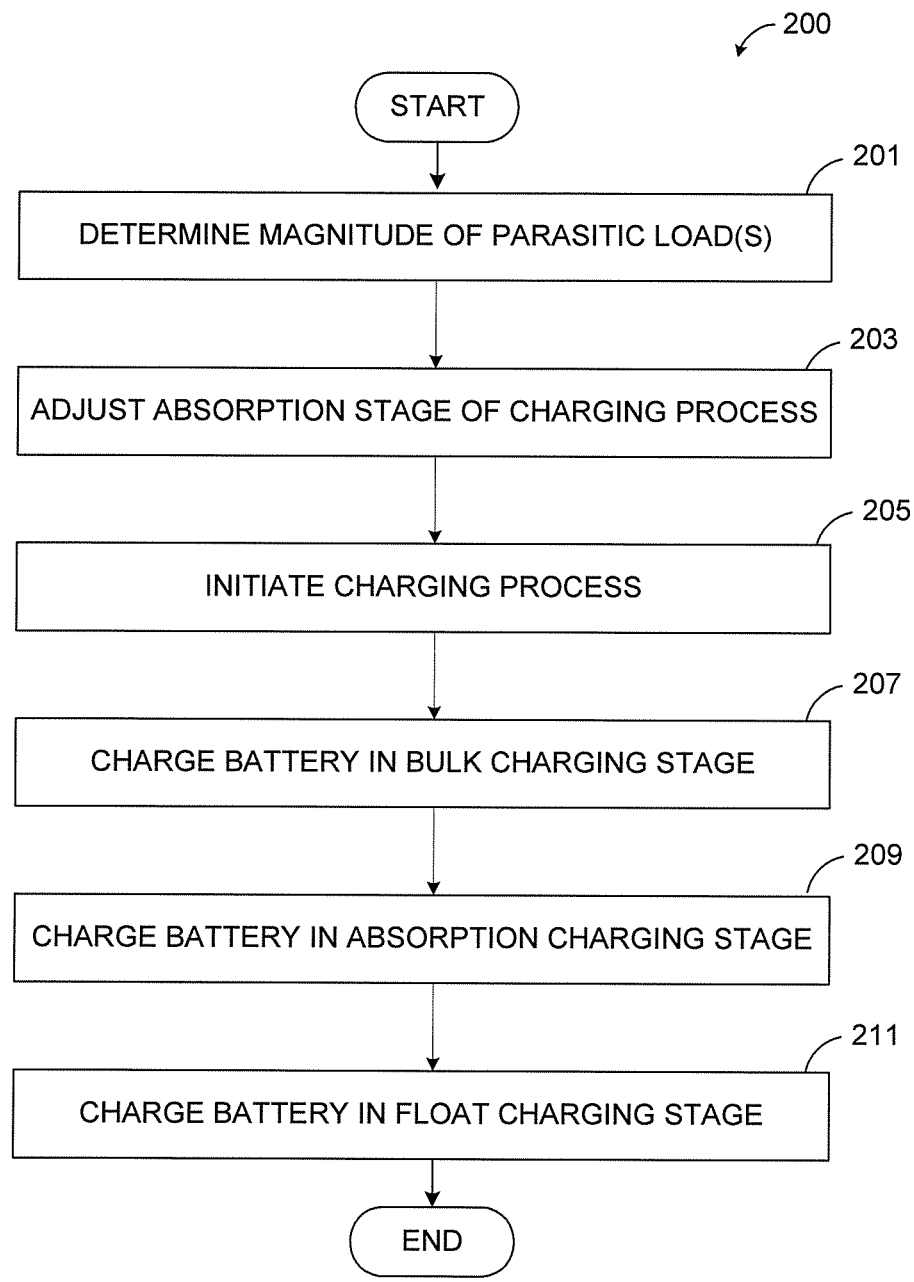
FIG. 2 illustrates an example method for charging a battery with parasitic load compensation, according to an embodiment of this disclosure.

FIGS. 1 and 2, discussed below, and the various embodiments used to describe the principles of the present disclosure in this patent document are by way of illustration only and should not be construed in any way to limit the scope of this disclosure. Those skilled in the art will understand that the principles of the present disclosure may be implemented in any type of suitably arranged device or system.

A typical three-step battery charger uses a charging process that includes three distinct charging stages: a bulk charging stage, an absorption stage, and a float stage. In the bulk charging stage, the battery is charged quickly from a low charge level to a substantially higher charge level (e.g., 80%-90% of full capacity) using a constant charging current (often a maximum rated current of the battery charger or a maximum rated input current of the battery, e.g., 15 amps) and a steadily increasing charging voltage. Once the charging voltage approaches a maximum voltage known as the absorption voltage (which, for a lead acid battery, may be 14.0 volts), the charging voltage levels off at the absorption voltage and the charging current decreases quickly (e.g., decreases from the 15 amps maximum). This is the start of the absorption stage.

In the absorption stage, the battery is charged more slowly to nearly full capacity (e.g., 95% charge level), with a decreasing charging current at a constant absorption voltage (e.g., 14.0 volts). Once the charging current decreases to a suitably low level (e.g., approximately 1-2 amps), the battery is almost charged and the charging voltage is reduced to the float voltage (which may be 13.25 volts for a lead acid battery). This is the start of the float stage. Most chargers also include a safety timer that is reset at the start of the absorption stage and expires after a predetermined period of time (e.g., 1 hour, 3 hours, or 10 hours). At the expiration of the predetermined period of time, such chargers automatically switch to the float stage regardless of current level of the charging current.

In the float stage, the battery is charged to full capacity or is maintained at full capacity using a low maintenance current (e.g., 1-2 amps or less) at the float voltage. The float voltage is a safe voltage level (e.g., 13.25 volts) at which the battery can be charged indefinitely without damage. The float stage allows the battery to be connected to the battery charger in a charging state for a long period of time without significant damage. This is in contrast to the absorption stage with the higher absorption voltage (e.g., 14.0 volts), which is safe for short charging periods but can damage the battery if the battery is exposed to the absorption voltage for long periods of time.

When a battery that is not subject to any substantial power load is charged using the three-step charging process, the battery can be quickly and safely charged without any significant damage to the battery. However, in some environments, the battery may be subject to continuous or intermittent parasitic power loads while the battery is being charged. For example, if a battery constantly supplies power to a device or appliance, even while the battery is being charged, the power load of the device or appliance is considered a parasitic load on the battery. In many cases, the parasitic load can be measured based on the amount of current it draws from the battery. As used herein, "parasitic load" can refer to a device (or devices) that generates a parasitic power load, the power load itself (e.g., measured in watts), or the current supplied for the power load (e.g., measured in amps).

During the absorption stage of the three-step charging process, if the parasitic load current is always greater than the lowest current in the absorption stage (e.g., 1-2 amps), the battery charger may be required to continuously provide charging current greater than the lowest absorption stage current in order to provide power for the parasitic load. In such a case, since the charging current does not decrease to the lowest absorption stage current, the battery charger may remain in the absorption stage indefinitely or until the expiration of the safety timer. Moreover, if the charging process is occasionally or frequently interrupted (e.g., the battery is a vehicle battery and the charger is frequently unplugged so that the vehicle can be used), the safety timer may be frequently reset. This, in turn, may subject the battery to the absorption voltage for an unnecessarily long period of time, which can damage the battery.

To resolve this issue, embodiments of this disclosure provide a system and method for charging a battery with parasitic load compensation. The system and method identify the parasitic load(s) and update a three-step charging process to compensate for the parasitic load(s), so that the battery charger will not remain in the absorption stage for a long period of time.

FIG. 1 illustrates an example system for charging a battery with parasitic load compensation, according to an embodiment of this disclosure. The embodiment of the system 100 illustrated in FIG. 1 is for illustration only. Other embodiments could be used without departing from the scope of this disclosure.

As shown in FIG. 1, the system 100 includes a battery charger 110, a vehicle 120, a battery 130, one or more parasitic loads 140, and a power source 150. The system optionally includes a current sensor 160. The battery charger 110 includes a controller 112, a memory 114, a user interface 116, and a battery charging circuit 118.

The vehicle 120 is any vehicle that includes a battery for proper operation. In particular embodiments, the vehicle 120 could be an emergency response or public safety vehicle, such as a fire truck or ambulance. In other embodiments, the vehicle 120 could be a standard automobile. In still other embodiments, the vehicle 120 could be a boat or personal watercraft. While described as a vehicle, the vehicle 120 could alternatively be another type of device that is partially or completely dependent on the battery 130 for operation. For example, the vehicle 120 could actually be a large power appliance or a piece of heavy machinery that operates using a battery.

The battery 130 supplies power used by the vehicle 120 or one or more accessories associated with the vehicle 120, including the parasitic loads 140. The battery 130 can be a lead acid or gel-cell battery, or may be another type of battery, such as an absorbent glass mat (AGM) battery or an Odyssey battery. The battery 130 is rechargeable and can be recharged using a battery charger, such as the battery charger 110. The battery 130 can also be recharged by an alternator in the vehicle 120 while the vehicle 120 is running, as known in the art. In some embodiments, the battery 130 supplies DC power to assist in starting the vehicle 120, and to operate the one or more accessories, including the parasitic loads 140.

The parasitic loads 140 are devices associated with the vehicle 120 that receive power from the battery 130 for operation. For example, when the vehicle 120 is an emergency response vehicle, such as a fire truck, the parasitic loads 140 can include various accessories used in fire/rescue operations, such as a flashlight, gas detector, or computer. Each parasitic load 140 may be powered directly from the battery 130 or may have its own battery or power source that is charged by power received from the battery 130. That is, the battery 130 may supply power to recharge the battery for one or more of the parasitic loads 140. The parasitic loads 140 are "parasitic" in the sense that the loads 140 continuously or intermittently receive power from the battery 130, thereby draining the battery 130, even when the vehicle 120 is turned off. For example, a computer 140 on a fire truck 120 may be "on" and receiving power from the fire truck battery 130 even when the fire truck 120 is turned off and parked at the fire station.

The power source 150 represents an AC power source, such as a standard 120 volt wall outlet. The power source 150 supplies power to the battery charger 110 for operating the battery charger 110 and for use in charging the battery 130. In some embodiments, the power source 150 may supply power at other voltages, such as 220 volts or 240 volts.

The current sensor 160 is an optional component of the system 100. The current sensor 160 can be positioned between the battery 130 and the parasitic loads 140, and can automatically monitor the parasitic loads 140 and determine the current drawn at the battery 130 for use by the parasitic loads. This current value can be automatically transmitted by the current sensor 160 to the battery charger 110 in real time. In some embodiments, the current sensor 160 is a shunt or a Hall effect current sensor. In other embodiments, the current sensor 160 can be another suitable device for detecting or measuring current.

The battery charger 110 is configured to couple to the battery 130 and charge the battery 130 using power supplied by the power source 150. In some embodiments, the battery charger 110 is a self-contained charger unit having its own housing. The battery charger 110 may include one or more mounting plates, brackets, fasteners, or other suitable connecting means to allow the housing of the battery charger 110 to be securely mounted in or on the vehicle 120. In other embodiments, the battery charger 110 may include one or components configured to be completely integrated into the vehicle 120, such as during the manufacture of the vehicle 120. In still other embodiments, the battery charger 110 may be configured as a portable unit that temporarily couples to the vehicle 120 for the purpose of charging the battery 130, and is uncoupled from the vehicle 120 when not being used.

The controller 112 controls the overall operations, including the battery charging operations, of the battery charger 110. The controller 112 controls the battery charging operations according to one or more programs, applications, or other software instructions stored in the memory 114. The controller 112 may include a single processor, multiple processors, one or more multi-processor cores, or any other type of processor or controller elements configured to process software instructions from the memory 114. As an example, the controller 112 may be implemented using a number of heterogeneous processor systems in which a main processor is present with secondary processors on a single chip. As another example, the controller 112 may be a symmetric multi-processor system containing multiple processors of the same type. Any suitable processing or controlling device(s) could be used.

The memory 114 is any piece of hardware capable of storing information, such as data, program code, or other suitable information on a temporary or permanent basis. The memory 114 may be a random access memory or other volatile or non-volatile storage device(s). The memory 114 may contain one or more components or devices, such as a hard drive, flash memory, optical disc, or other persistent storage device(s). A storage device may be fixed or removable, such as when a removable hard drive or USB thumb drive is used.

The user interface 116 allows for input by a user and output of information to a user using components connected to or integrated within the battery charger 110. For example, the user interface 116 may provide for user input through a keyboard, keypad, mouse, touchscreen, switches, knobs, levers, or other input device(s). In one particular embodiment, the user interface 116 includes one or more DIP (dual in-line package) switches for inputting a parasitic load value. The user interface 116 may also provide output to a user via a display, printer, or other output device.

The battery charging circuit 118 represents one or more circuit components configured to receive AC power from the power source 150 and convert the AC power into DC power at a voltage and amperage determined by the controller 112. The battery charging circuit 118 supplies the DC power to the battery 130 during a battery charging operation according to control instructions from the controller 112. In accordance with this disclosure, the battery charging circuit 118 supplies power to the battery 130 according to a three-step battery charging process that compensates for the parasitic loads 140.

Although FIG. 1 illustrates one example of a system 100 that can be used for synchronizing contact information across a plurality of contact information repositories, various changes may be made to FIG. 1. For example, certain ones of the various components of system 100 (the battery charger 110, vehicle 120, battery 130, parasitic loads 140, power source 150, controller 112, memory 114, user interface 116, and battery charging circuit 118) may be combined, rearranged, duplicated, separated into sub-components, or replaced with other components.

FIG. 2 illustrates an example method 200 for charging a battery with parasitic load compensation, according to an embodiment of this disclosure. The embodiment illustrated in FIG. 2 is for illustration only. Other embodiments could be used without departing from the scope of this disclosure. The method 200 is described as being performed in connection with the system 100 of FIG. 1. Of course, the method 200 could be performed by any other suitable device or in any other suitable system.

At operation 201, a magnitude of the parasitic load(s) 140 on the battery 130 is determined at the battery charger 110. This may include a user estimating a total maximum parasitic load current and inputting the total maximum parasitic load current at the user interface 116 of the battery charger 110. As a particular example, the user may determine that the total maximum parasitic load for a fire truck is 4 amps. The user then sets DIP switches associated with the battery charger on the fire truck to positions corresponding to 4 amps. In another embodiment, the magnitude of the parasitic loads 140 is determined in real time using the current sensor 160, which directly measures the current or power supplied to the parasitic loads 140. In such an embodiment, the current sensor 160 may provide the measurement of the parasitic loads 140 to the battery charger 110.

At operation 203, an absorption stage of a three-step battery charging process is adjusted based on the determined magnitude of parasitic load. This may include the battery charger 110 adjusting a minimum current value for the absorption stage to the maximum parasitic load determined in operation 201 (e.g., 4 amps). The battery charger 110 may store the adjusted minimum current value in the memory 114.

At operation 205, the three-step battery charging process is initiated. This may include a user connecting the battery charger 110 to the power source 150 after the vehicle 120 is parked and turned off. As a particular example, after the fire truck returns to the fire station following a call, the fire truck is parked and turned off, and the battery charger for the fire truck's battery is activated by plugging the battery charger into a wall outlet. This initiates the battery charging process. In some embodiments, the battery charger 110 may be a stand-alone unit separate from the vehicle 120. In such embodiments, the battery charger 110 is manually connected to both the power source (e.g., wall outlet) 150 and the battery 130.

At operation 207, the battery charger 110 charges the battery 130 according to a bulk charging stage of the adjusted three-step charging process. This may include the battery charger 110 quickly charging the battery 130 to 80%-90% of full capacity. As a particular example, the fire truck battery may be bulk charged to 80%-90% of full capacity. If the battery is already at or near 80%-90% of capacity, the bulk charging stage may proceed for a short duration (e.g., only a few seconds or a couple of minutes).

At operation 209, the battery charger 110 charges the battery 130 according to the adjusted absorption stage of the adjusted three-step charging process. This may include the battery charger 110 charging the battery 130 at a higher absorption voltage until the charger 110 determines that the charging current decreases to the adjusted minimum current value for the absorption stage, as set in operation 203. As a particular example, the battery charger at the fire station may absorption charge the fire truck battery until the charging current decreases to 4 amps, which is the determined maximum parasitic load at the fire truck.

Once the absorption charging current decreases to the adjusted lowest current value, the battery charger 110 moves to the float stage of the adjusted three-step charging process, and charges the battery 130 according to the float stage, at operation 211. This may include the battery charger 110 charging the battery 130 at a lower float voltage until the battery 130 is fully charged. As a particular example, the battery charger at the fire station may float charge the fire truck battery until the battery is fully charged or until the battery charger is unplugged. If the parasitic loads 140 continue to draw current and drain the battery 130, the charger 110 continues to charge the battery 130 in the float stage.

Because the adjusted lowest current value for the absorption stage is set higher that a typical minimum absorption stage current (i.e., 1-2 amps), the battery charger 110 is able to reach the adjusted lowest current level in the absorption stage and switch to the float stage, even though the parasitic loads 140 are present and drawing current from the battery 130. Thus, the battery charger 110 is able to switch to the float stage and its lower, safer voltage level, instead of staying in the absorption stage for an extended period of time subject to a safety timer. Stated another way, the current drawn by the parasitic loads 140 does not cause the battery charger 110 to remain in the absorption stage for a long period of time; thus, the battery charger 110 compensates for the parasitic loads 140 during the charging process.

Although FIG. 2 illustrates one example of a method 200 for synchronizing contact information across a plurality of contact information repositories, various changes may be made to FIG. 2. For example, various operations shown in FIG. 2 could overlap, occur in parallel, or occur multiple times. Moreover, some operations could be combined or removed and additional operations could be added.

In some embodiments, various functions described above are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

It may be advantageous to set forth definitions of certain words and phrases used throughout this patent document. The terms "application" and "program" refer to one or more computer programs, software components, sets of instructions, procedures, functions, objects, classes, instances, related data, or a portion thereof adapted for implementation in a suitable computer code (including source code, object code, or executable code). The terms "transmit" and "receive," as well as derivatives thereof, encompass both direct and indirect communication. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method comprising:
   determining a magnitude of a parasitic load on a battery;
   adjusting an absorption stage of a multi-step charging process for the battery based on the determined magnitude of the parasitic load; and
   charging the battery using the multi-step charging process with the adjusted absorption stage.

2. The method of claim 1, wherein adjusting the absorption stage comprises adjusting a minimum current value of the absorption stage to the determined magnitude of the parasitic load.

3. The method of claim 2, wherein charging the battery using the multi-step charging process with the adjusted absorption stage comprises:
   charging the battery at a predetermined higher charging voltage level until the charging current to the battery decreases to the minimum current value; and
   charging the battery at a predetermined float charge voltage level once the charging current to the battery is less than or equal to the minimum current value.

4. The method of claim 1, wherein the magnitude of the parasitic load is determined based on a value input by a user.

5. The method of claim 1, wherein the magnitude of the parasitic load is determined based on a value measured by a current sensor coupled to the parasitic load and the battery.

6. The method of claim 1, wherein the battery is a battery for operating a vehicle and the battery is charged using a battery charger that is built into the vehicle.

7. The method of claim 6, wherein the vehicle is an emergency response or public safety vehicle.

8. A battery charging apparatus comprising:
   a memory; and
   a controller configured to:
      determine a magnitude of a parasitic load on a battery and store the determined magnitude of the parasitic load in the memory;
      adjust an absorption stage of a multi-step charging process for the battery based on the determined magnitude of the parasitic load; and
      control a charging of the battery using the multi-step charging process with the adjusted absorption stage.

9. The battery charging apparatus of claim 8, wherein adjusting the absorption stage comprises adjusting a minimum current value of the absorption stage to the determined magnitude of the parasitic load.

10. The battery charging apparatus of claim 9, wherein charging the battery using the multi-step charging process with the adjusted absorption stage comprises:
    charging the battery at a predetermined higher charging voltage level until the charging current to the battery decreases to the minimum current value; and
    charging the battery at a predetermined float charge voltage level once the charging current to the battery is less than or equal to the minimum current value.

11. The battery charging apparatus of claim 8, wherein the magnitude of the parasitic load is determined based on a value input by a user.

12. The battery charging apparatus of claim 8, wherein the magnitude of the parasitic load is determined based on a value measured by a current sensor coupled to the parasitic load and the battery.

13. The battery charging apparatus of claim 8, wherein the battery is a battery for operating a vehicle and the battery charging apparatus is built into the vehicle.

14. The battery charging apparatus of claim 13, wherein the vehicle is an emergency response or public safety vehicle.

15. A non-transitory computer readable storage medium comprising instructions that, when executed by at least one processing device, cause the at least one processing device to:
    determine a magnitude of a parasitic load on a battery;
    adjust an absorption stage of a multi-step charging process for the battery based on the determined magnitude of the parasitic load; and
    control a charging of the battery using the multi-step charging process with the adjusted absorption stage.

16. The computer readable storage medium of claim 15, wherein adjusting the absorption stage comprises adjusting a minimum current value of the absorption stage to the determined magnitude of the parasitic load.

17. The computer readable storage medium of claim 16, wherein charging the battery using the multi-step charging process with the adjusted absorption stage comprises:
- charging the battery at a predetermined higher charging voltage level until the charging current to the battery decreases to the minimum current value; and
- charging the battery at a predetermined float charge voltage level once the charging current to the battery is less than or equal to the minimum current value.

18. The computer readable storage medium of claim 15, wherein the magnitude of the parasitic load is determined based on a value input by a user.

19. The computer readable storage medium of claim 15, wherein the magnitude of the parasitic load is determined based on a value measured by a current sensor coupled to the parasitic load and the battery.

20. The computer readable storage medium of claim 15, wherein the battery is a battery for operating a vehicle and the battery charging apparatus is built into the vehicle.

* * * * *